United States Patent
Akune et al.

[11] Patent Number: 5,856,796
[45] Date of Patent: *Jan. 5, 1999

[54] SAMPLING RATE CONVERTING METHOD AND APPARATUS

[75] Inventors: Makoto Akune; Tadao Suzuki, both of Tokyo, Japan

[73] Assignee: Sony Corporation, Tokyo, Japan

[*] Notice: The term of this patent shall not extend beyond the expiration date of Pat. No. 5,719,571.

[21] Appl. No.: 905,909

[22] Filed: Aug. 4, 1997

Related U.S. Application Data

[62] Division of Ser. No. 715,430, Sep. 18, 1996, Pat. No. 5,719,571.

[30] Foreign Application Priority Data

Sep. 22, 1995 [JP] Japan ................................. 7-244962

[51] Int. Cl.⁶ ............................................. H03M 17/00
[52] U.S. Cl. ........................................ 341/61; 364/724.1
[58] Field of Search ............................. 341/61, 50, 143; 364/724.1

[56] References Cited

U.S. PATENT DOCUMENTS

| | | | |
|---|---|---|---|
| 4,020,332 | 4/1977 | Crochiere | 341/61 |
| 5,126,737 | 6/1992 | Torii | 341/61 |
| 5,225,787 | 7/1993 | Therssen | 328/15 |
| 5,329,282 | 7/1994 | Jackson | 341/143 |
| 5,457,456 | 10/1995 | Norsworthy | 341/61 |

*Primary Examiner*—Brian K. Young
*Assistant Examiner*—Peguy JeanPierre
*Attorney, Agent, or Firm*—Jay H. Maioli

[57] ABSTRACT

A sampling rate converting method and apparatus for converting the sampling frequency of a 1-bit digital data obtained a ΣΔ modulator to 32 kHz, 48 kHz, 96 kHz or 192 kHz without producing jitter. A decimation filter 3 decimates the sampling frequency of 1-bit digital data of 2.8224 MHz supplied from an input terminal 2 by 1/2-tuple decimation. An interpolation filter 4 oversamples the frequency of the output of the decimation filter 3 by quintuple oversampling with an integer ratio of 1:5. A decimation filter 5 decimates the frequency of the output of the interpolation filter 4 by 1/21-tuple decimation with an integer ratio of 21:1.

9 Claims, 8 Drawing Sheets

SAMPLING RATE CONVERTING METHOD AND APPARATUS

This is a division of application Ser. No. 08/715,430 filed Sep. 18, 1996, now U.S. Pat. No. 5,719,571.

BACKGROUND OF THE INVENTION

1. Field of the Invention

This invention relates to a sampling rate converting method and apparatus for converting by filtering the sampling frequency of a 1-bit digital data equal to 64 times 44.1 Khz or the sampling frequency of 1-bit digital data equal to 49 times 48 kHz.

2. Description of the Related Art

The method for digitizing speech signals for recording, reproduction and transmission has hitherto been practiced on a recording/reproducing apparatus having an optical disc, such as a compact disc (CD), a magnetic tape, such as a digital audio tape (DAT), or in digital broadcasting such as satellite broadcasting. In digitizing the speech signals in such digital audio data transmitting method, it has been prescribed to use formats 48 kHz or 44.1 kHz as the sampling frequency and 16 or 20 bits as the numbers of quantization bits.

As another method for digitizing the speech signals, a method known as a sigma-delta ($\Sigma\Delta$) has been proposed, as shown in Yoshio Yamazaki, "AD/DA Converter and Digital Filter", Journal of Japan Society of Acoustics, vol. 46, No. 3 (1990) pages 251 to 257.

An arrangement of a ($\Sigma\Delta$) modulator for performing the ($\Sigma\Delta$) modulation of, for example, one bit, is shown in FIG. 1, in which an input audio signal at an input terminal 91 is supplied via an adder 92 to an integrator 93. The signal from the integrator 93 is fed to a comparator 94 so as to be compared to, for example, the neutral potential of the input audio signal and quantized by, for example, one-bit quantization each sampling period. The frequency of the sampling periods, that is the sampling frequency, is selected to be 64, 49 or 128 times the conventional sampling frequency of 48 kHz or 44.1 kHz.

These quantization data are fed to a one-sample delay unit 96 so as to be delayed by one sampling period. The delayed data is converted by, for example, a 1-bit D/A converter 95 into analog signals which are supplied to the adder 92 so as to be added to the input audio signal from the input terminal 91. Output quantized data from the comparator 94 is taken out at an output terminal 97. Thus, with the $\Sigma\Delta$ modulation by the $\Sigma\Delta$ modulator, an audio signal having a wide dynamic range can be obtained, even with the number of bits as small as one bit, by using a sufficiently high sampling frequency. In addition, the frequency range that can be transmitted can be increased.

In addition, the $\Sigma\Delta$ modulation has a circuit arrangement that lends itself to integration and can achieve high precision in A/D conversion relatively easily, so that it is frequently used within an A/D converter. The $\Sigma\Delta$ modulated signals can be passed through a simple analog low-pass filter for restoration to the analog audio signal. Therefore, by exploiting these features, the $\Sigma\Delta$ modulator can be applied to a recorder handling high-quality data or to data transmission.

Meanwhile, should it become necessary to convert the 1-bit digital data obtained by the $\Sigma\Delta$ modulator into digital data having the sampling frequency of 32 kHz or 48 kHz, accurate conversion has so far not been achieved due to jitter or the like.

For example, if the sampling frequency of 1-bit digital data, which is 64 times 32 kHz, is to be converted into a sampling frequency of 48 kHz, the result of calculations gives 32000×64/48000=42.6 . . . which is not a whole number, so that accurate conversion is not feasible.

On the other hand, if the sampling frequency of 1-bit digital data, which is 64 times 48 kHz, is to be converted into a sampling frequency of 44.1 kHz, the result of calculations gives 48000×64/44100=69.65 . . . which is not a whole number, so that accurate conversion is again not feasible.

The same holds for the case of converting the sampling frequency of one-bit digital data equal to 64 times 96 kHz into 44.1 kHz.

SUMMARY OF THE INVENTION

It is therefore a primary object of the present invention to provide a method and apparatus for converting the sampling frequency whereby the sampling frequency 64 fs of 1-bit digital data can be accurately converted into 32 kHz, 48 kHz, 96 kHz or 192 kHz without producing jitter.

It is a second object of the present invention to provide a method and apparatus for converting the sampling frequency whereby the sampling frequency 64 fs of 1-bit digital data can be converted into the sampling frequency of 44.1 kHz of a compact disc (CD).

In one aspect, the present invention provides a method for converting the sampling rate of a one-bit data signal obtained by $\Sigma\Delta$ modulation into a 24-bit signal at 32 kHz, 48 kHz, 96 kHz, or 192 kHz, without producing any jitter by decimating in a decimation filter the 2.8224 MHZ sampling frequency of the 1-bit digital signal by a selected decimation factor and then oversampling the output of the decimation filter in a quintuple interpolation filter to arrive at one of the above output sampling frequencies. By constructing additional stages and selecting the decimation factors, all of the sampling frequencies can be produced using integer ratios, thereby precluding the production of jitter during the sampling frequency conversion.

DESCRIPTION OF THE PREFERRED EMBODIMENTS

Figure 1:
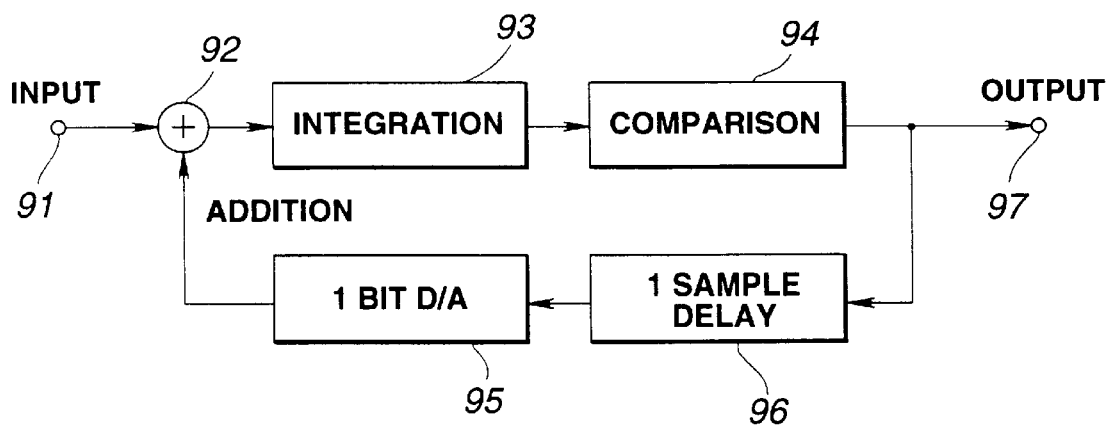
FIG. 1 is a block diagram showing an illustrative arrangement of a prior are $\Sigma\Delta$ modualtor.
Figure 2:
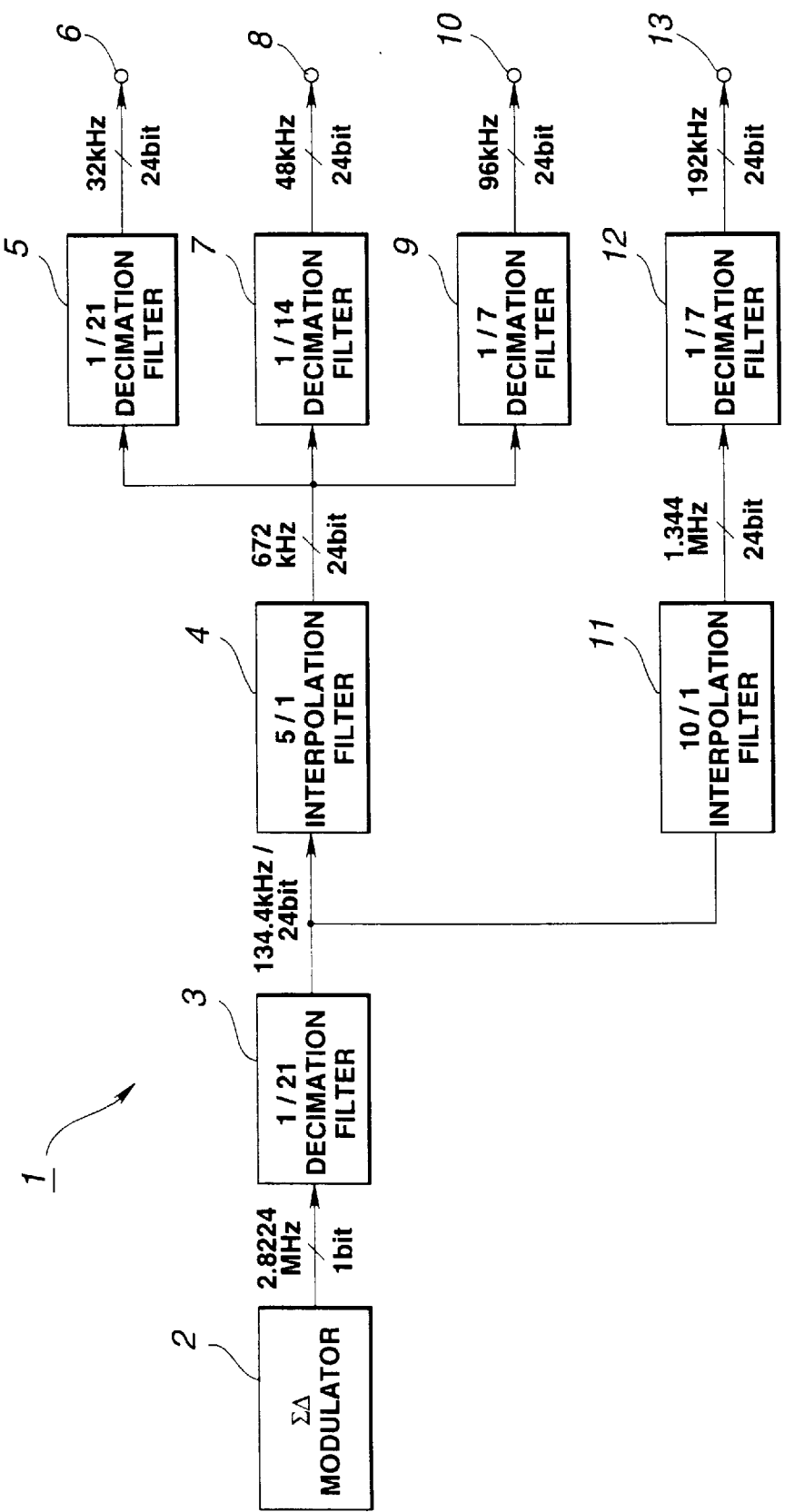
FIG. 2 is a block diagram showing an arrangement of a first embodiment of a rate converting device according to the present invention.

Referring to the drawings, a preferred first embodiment of the sampling rate converting method and apparatus according to the present invention will be explained. The illustrated embodiment in FIG. 2 is directed to a rate converter 1 for converting the 1-bit digital data of 64 times 44.1 kHz of the sampling frequency obtained by $\Sigma\Delta$ modulation into multi-bit, such as 24-bit, digital data having the sampling frequencies of 32 kHz, 48 kHz, 96 kHz and/or 192 kHz.

It is noted that 44.1 kHz is a sampling frequency for PCM audio data recorded on, for example, compact discs (CDs) while 32 kHz is a sampling frequency for data recorded on a digital audio tape (DAT) or a sampling frequency for audio data for satellite broadcasting (BS). On the other hand, 96 kHz is a sampling frequency for high-sampling audio data, while 192 kHz is a sampling frequency for super-digital audio data.

The rate converter 1 includes a decimation filter 3 for 1/21-tuple decimation of the sampling frequency of 2.8224 Mhz of the 1-bit digital data supplied from the $\Sigma\Delta$ modulator 2 equal to 64 times as large as 44.1 kHz, that is 2.8224 MHz, with an integer ratio of 21:1, and an interpolation filter 4 for quintuple oversampling of the frequency of an output of the decimation filter 3 at an integer ratio of 1/5. The rate converter 1 includes a decimation filter 5 for 21-tuple decimation of the frequency of an output of the interpolation filter 4 at an integer ratio of 1/21 and a decimation filter 7 for 1/14-tuple decimation of the frequency of an output of the interpolation filter 4 at an integer ratio of 1/14. The rate converter 1 includes a decimation filter 9 for 1/7-tuple decimation of the frequency of an output of the interpolation filter 4 at an integer ratio of 7:1 and an interpolation filter 11 for ten-tuple oversampling of the frequency of an output of the decimation filter 3 at an integer ratio of 1:10. The rate converter 1 further includes a decimation filter 12 for 1/7-tuple decimation of the frequency of an output of the interpolation filter 11 at an integer ratio of 7:1.

The interpolation filters 4 and 11 represent oversampling means for multiplying the frequency of the output of the decimation filter 3 by 1:5 m, where m is an integer. With the interpolation means 4 and 11, m=1 and m=2, respectively.

The decimation filters 5, 7, 9 and 12 represent decimation means for multiplying the frequency of the output of the oversampling means by 1/7n with an integer ratio of 7 n:1, where n is an integer. With the decimation filters 5 and 7, n=3 and n=2, respectively, whereas, with the decimation filters 9 and 12, n=1.

The rate converter 1 operates as follows: The $\Sigma\Delta$ modulator 2 routes 1-bit digital data with a sampling frequency equal to 44.1 kHz times 64, that is 2.8224 MHz, to the decimation filter 3.

The decimation filter 3 re-quantizes the 1-bit digital data with a period equal to 2.8224 MHz times 1/21, that is 134.4 kHz, after attenuation of the frequency not lower than 67.2 kHz, in order to output multi-bit digital data of 134.4 kHz/24 bits. This decimation filter 3 produces no jitter since it decimates the 1-bit digital data of 2.8224 MHz by the integer ratio of 21:1.

The multi-bit digital data with 134.4 kHz/24 bits is supplied to the interpolation filters 4 and 11.

The interpolation filter 4 re-quantizes the multi-bit digital data of 134.4 kHz/24 bits with a period of 672 kHz by quintuple oversampling, as it attenuates the frequency not lower than 67.2 kHz, for outputting multi-bit digital data of 672 kHz/24 bits, and supplying the data to the decimating filters 5, 7 and 9. The interpolation filter 4 oversamples the multi-bit digital data of 134.4 kHz/24 bits by an integer ratio of 1:5, so that no jitter is produced.

The interpolation filter 5 re-quantizes the multi-bit digital data of 672 kHz/24 bits with a period of 32 kHz, which is 1/21 times 662 kHz, as it attenuates the frequency not lower than 16 kHz, for outputting multi-bit digital data of 32 kHz/24 bits at an output terminal 6. The decimation filter 5 decimates the multi-bit digital data of 672 kHz/24 bits by an integer ratio of 21:1, so that no jitter is produced.

The decimation filter 7 re-quantizes the multi-bit digital data of 672 kHz/24 bits with a period of 24 kHz, which is 1/14 times 672 kHz, after attenuating the frequency not lower than 24 kHz, for outputting multi-bit digital data of 48 kHz/ 24 bits at an output terminal 8. The interpolation filter 7 decimates the multi-bit digital data of 672 kHz/24 bits by an integer ratio of 14:1, so that no jitter is produced.

The decimation filter 9 re-quantizes the multi-bit digital data of 672 kHz/24 bits with a period of 96 kHz, which is 1/7 times 672 kHz, after attenuating the frequency not lower than 48 kHz, for outputting multi-bit digital data of 96 kHz/24 bits at an output terminal 8. The decimation filter 9 decimates the multi-bit digital data of 672 kHz/24 bits by an integer ratio of 7:1, so that no jitter is produced.

The interpolation filter 11 re-quantizes the multi-bit digital data of 134.4 kHz/24 bits with a period of 1.344 MHz by 10-tuple oversampling, as it attenuates the frequency not lower than 67.2 kHz, for outputting multi-bit digital data of 1.344 MHz/24 bits, and for supplying the data to the decimating filter 12. The interpolation filter 11 oversamples the multi-bit digital data of 134.4 kHz/24 bits by an integer ratio of 1:10, so that no jitter is produced.

The decimation filter 12 re-quantizes the multi-bit digital data of 1.344 MHz/24 bits with a period of 96 kHz, which is 1/7 times 1.344 MHz, after attenuating the frequency not lower than 96 kHz, for outputting multi-bit digital data of 192 kHz/24 bits at an output terminal 13. The decimation filter 12 decimates the multi-bit digital data of 1.344 MHz/24 bits by an integer ratio of 7:1, so that no jitter is produced.

Thus it is possible with the rate converter 1 to convert the 1-bit digital data with the sampling frequency of 2.8224 MHz into multi-bit digital data of 32 kHz/24 bits, 48 kHz/24 bits, 96 kHz/24 bits and 192 kHz/24 bits, as jitter generation is suppressed by filtering employing an integer ratio.

Figure 3:
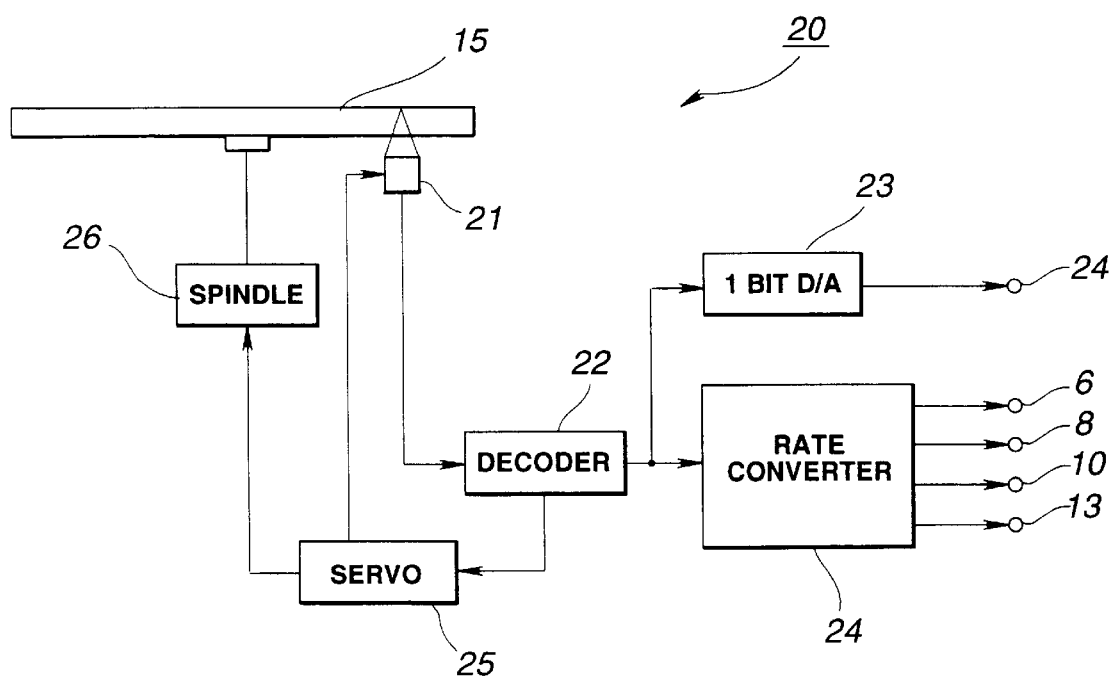
FIG. 3 is a schematic block diagram showing a disc reproducing apparatus to which can be applied the first embodiment shown in FIG. 2.

Such rate conversion device 1 may be applied to a disc reproducing apparatus 20 shown in FIG. 3. The disc reproducing apparatus 20 reproduces an optical disc 15 having recorded thereon 1-bit digital data having a sampling frequency of 2.8224 MHz which is 64 times 44.1 kHz and outputs high-quality analog audio signals at an output terminal 24, while outputting multi-bit digital data of 32 kHz/24 bits, 48 kHz/24 bits, 96 kHz/24 bits and 192 kHz/24 bits at output terminals 6, 8, 10 and 13, respectively.

The optical disc 15 is run in rotation by a spindle motor 26 driven at a constant linear velocity (CLV) by a driving signal from a servo circuit 25.

As the optical disc 15 is run in rotation, an optical pickup 21 radiates a laser light beam on the signal recording surface of the optical disc 15. This reflected light is detected for reading out the pit information formed on the optical disc 15.

The information read out by the pickup 21 is supplied to a decoder 22. The 1-bit digital data, having the sampling frequency of 2.8224 MHz, which is 64 times 44.1 kHz, is decoded and output by the decoder 22, and supplied to the 1-bit D/A converter 23 and to the rate converter 1.

The 1-bit D/A converter 23 converts the 1-bit digital data into analog data which is output at an output terminal 24.

The rate converter 1 converts the rate of the 1-bit digital data, as it suppresses jitter generation as described above, for outputting multi-bit digital data of 32 kHz/24 bits, 48 kHz/24 bits, 96 kHz/24 bits and 192 kHz/24 bits at output terminals 6, 8, 10 and 13, respectively.

Thus it is possible with the present disc reproducing apparatus 20 to reproduce the 1-bit digital data with the sampling frequency of 2.8224 MHz and to convert the 1-bit digital data into multi-bit digital data of 32 kHz/24 bits, 48 kHz/24 bits, 96 kHz/24 bits and 192 kHz/24 bits, as jitter generation is suppressed by filtering employing an integer ratio.

Figure 4:
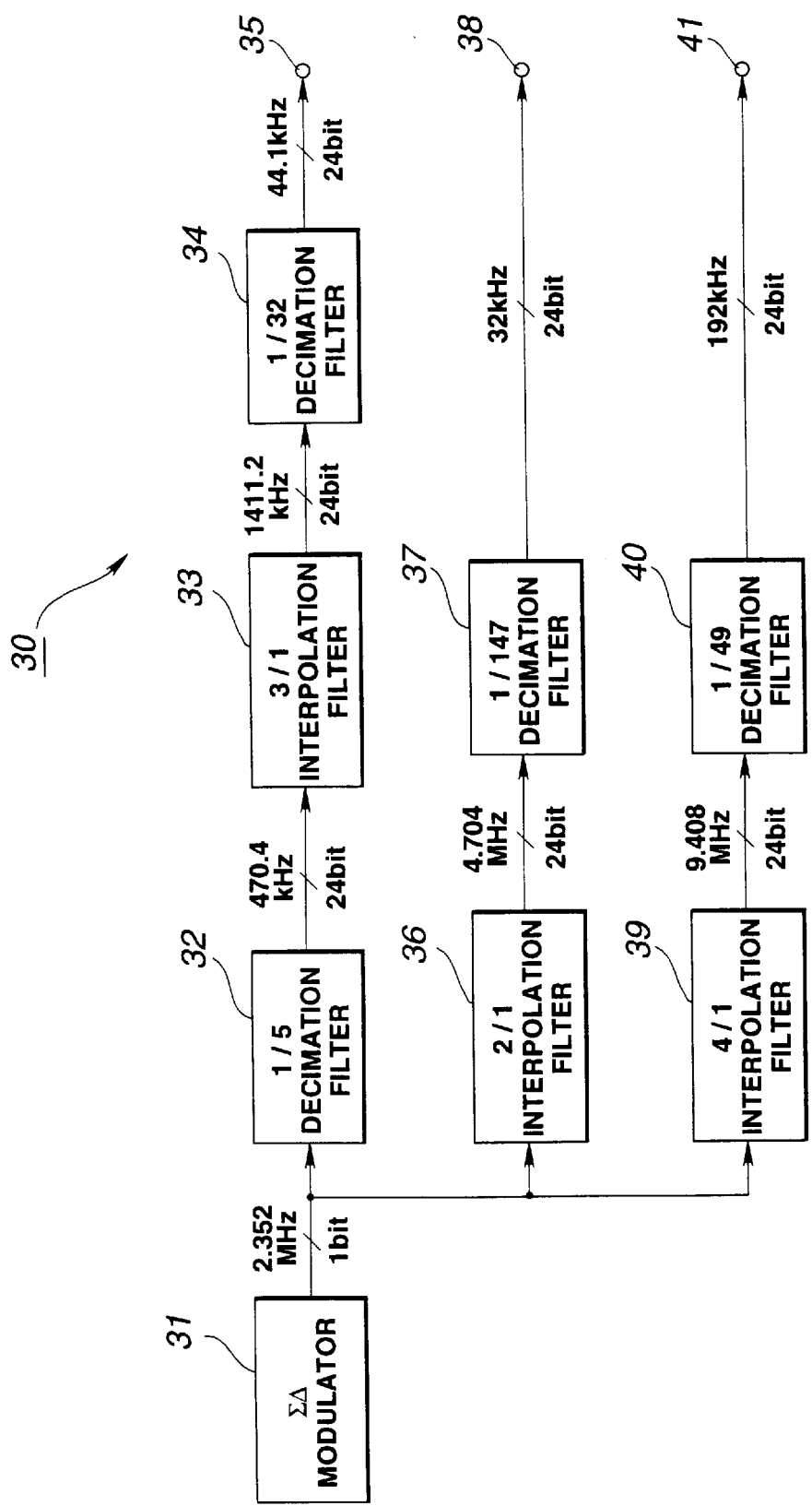
FIG. 4 is a block diagram showing an arrangement of a second embodiment of a rate converting device according to the present invention.

A preferred second embodiment of the method and apparatus of a sampling rate converter according to the present invention will be explained. The illustrated embodiment in FIG. 4 is directed to a rate converter 30 for converting the 1-bit digital data with the sampling frequency of 49 times 48 kHz into multi-bit, such as 24-bit, digital data having the sampling frequencies of 44.1 kHz, 32 kHz and 192 kHz.

The rate converter 30 includes a decimation filter 32 for 1/5-tuple decimation of the sampling frequency of the 1-bit digital data supplied from the EA modulator 31 equal to 49 times as large as 48 kHz or 2.28224 MHz with an integer ratio of 1:5, and an interpolation filter 33 for triple oversampling of the frequency of an output of the decimation filter 32 at an integer ratio of 1/3. The rate converter 30 also includes a decimation filter 34 for 1/32 decimation of the frequency of the output of the decimation filter 33 at an integer ratio of 32:1 for supplying the decimated output to an output terminal 35. The rate converter 30 also includes an decimation filter 36 for double oversampling of the sampling frequency of the 1-bit digital data with a sampling frequency equal to 49 times 48 kHz with an integer ratio of 1:2, and a decimation filter 37 for 1/147-tuple decimation of the frequency of an output of the decimation filter 36 at an integer ratio of 147:1 for supplying the decimated output to an output terminal 38. The rate converter 30 includes an decimation filter 39 for quadruple oversampling of the sampling frequency of the 1-bit digital data equal to 49 times 48 kHz at an integer ratio of 1:4 and a decimation filter 40 for 1/49-tuple decimation of the frequency of an output of the decimation filter 39 at an integer ratio of 49:1 for supplying the decimated output to an output terminal 41.

The rate converter 30 operates as follows: The ΣΔ modulator 31 routes 1-bit digital data with a sampling frequency equal to 49 times 48 kHz, that is 2.352 MHz, to the decimation filter 32, decimation filter 36 and to the decimation filter 39.

The decimation filter 32 re-quantizes the 1-bit digital data with a period equal to 470.4, equal to 1/5 times 2.352 MHz, after attenuation of the frequency not lower than 235.2 kHz, in order to output multi-bit digital data of 470.4 kHz/24 bits. This decimation filter 32 produces no jitter since it decimates the 1-bit digital data of 2.325 MHz by the integer ratio of 5:1.

The decimation filter 33 re-quantizes the multi-bit digital data of 470.4 kHz/24 bits with a period of 1411.2 kHz by triple oversampling, as it attenuates the frequency not lower than 235.2 kHz, for outputting multi-bit digital data of 1411.2 kHz/24 bits, and for supplying the data to the decimating filter 34. The decimation filter 33 oversamples the multi-bit digital data of 470.4 kHz/24 bits by an integer ratio of 1:3, so that no jitter is produced.

The decimation filter 34 re-quantizes the multi-bit digital data of 1411.2 kHz/24 bits with a period of 44.1 kHz, equal to 1/32 of 1411.2 kHz, after attenuating the frequency not lower than 22.05 kHz, for outputting multi-bit digital data of 44.1 kHz/24 bits, and for outputting the output digital data at an output terminal 35. The decimation filter 33 decimates the multi-bit digital data of 1411.2 kHz/24 bits by an integer ratio of 32:1, so that no jitter is produced.

The interpolation filter 36, supplied with the 2.352 MHz/1 bit digital data from the ΣΔ modulator 31 with the digital data of 2.352 MHz/1 bit, oversamples the 1-bit digital data of 2.352 MHz/24 bits with a period of 4.704 MHz by double oversampling, as it attenuates the frequency not lower than 1.176 MHz, for outputting multi-bit digital data of 4.704 MHz/24 bits, and supplying the data to the decimating filter 37. The decimation filter 36 oversamples the multi-bit digital data of 2.352 MHz/24 bits by an integer ratio of 1:2, so that no jitter is produced.

The decimation filter 37 re-quantizes the multi-bit digital data of 4.704 MHz/24 bits with a period of 32 kHz, which is 1/147 times 4.704 MHz, after attenuating the frequency not lower than 16 kHz, for outputting multi-bit digital data of 32 kHz/24 bits at an output terminal 38. The decimation filter 37 decimates the multi-bit digital data of 4.704 kHz/24 bits with an integer ratio of 147:1, so that no jitter is produced.

The decimation filter 39, supplied with the 2.352 MHz/1 bit digital data from the EA modulator 31, oversamples the 1-bit digital data of 2.352 MHz/24 bits with a period of 9.408 MHz by quadruple oversampling, as it attenuates the frequency not lower than 1.176 MHz, for outputting multi-bit digital data of 9.408 MHz/24 bits, and supplying the data to the decimating filter 40. The interpolation filter 39 oversamples the multi-bit digital data of 2.352 MHz/24 bits by an integer ratio of 1:4, so that no jitter is produced.

The decimation filter 40 re-quantizes the multi-bit digital data of 9.408 MHz/24 bits with a period of 192 kHz, which is 1/49 times 9.408 MHz, after attenuating the frequency not lower than 96 kHz, for outputting multi-bit digital data of 192 kHz/24 bits at an output terminal 41. The decimation filter 40 decimates the multi-bit digital data of 9.408 kHz/24 bits, so that no jitter is produced.

Thus it is possible with the present rate converter 30 to convert 1-bit digital data with the sampling frequency of 2.352 MHz into multi-bit digital data of 44.1 kHz/24 bits, 32 kHz/24 bits and 192 kHz/24 bits, as jitter generation is suppressed by filtering employing an integer ratio.

If the rate converter 30 is used in place of the rate converter 1 in the above disc reproducing apparatus 20, it becomes possible to reproduce the 1-bit digital data with the sampling frequency of 2.325 MHz and to convert the 1-bit digital data into multi-bit digital data of 44.1 kHz/24 bits, 32 kHz/24 bits and 192 kHz/24 bits, as jitter generation is suppressed by filtering employing an integer ratio.

Figure 5:
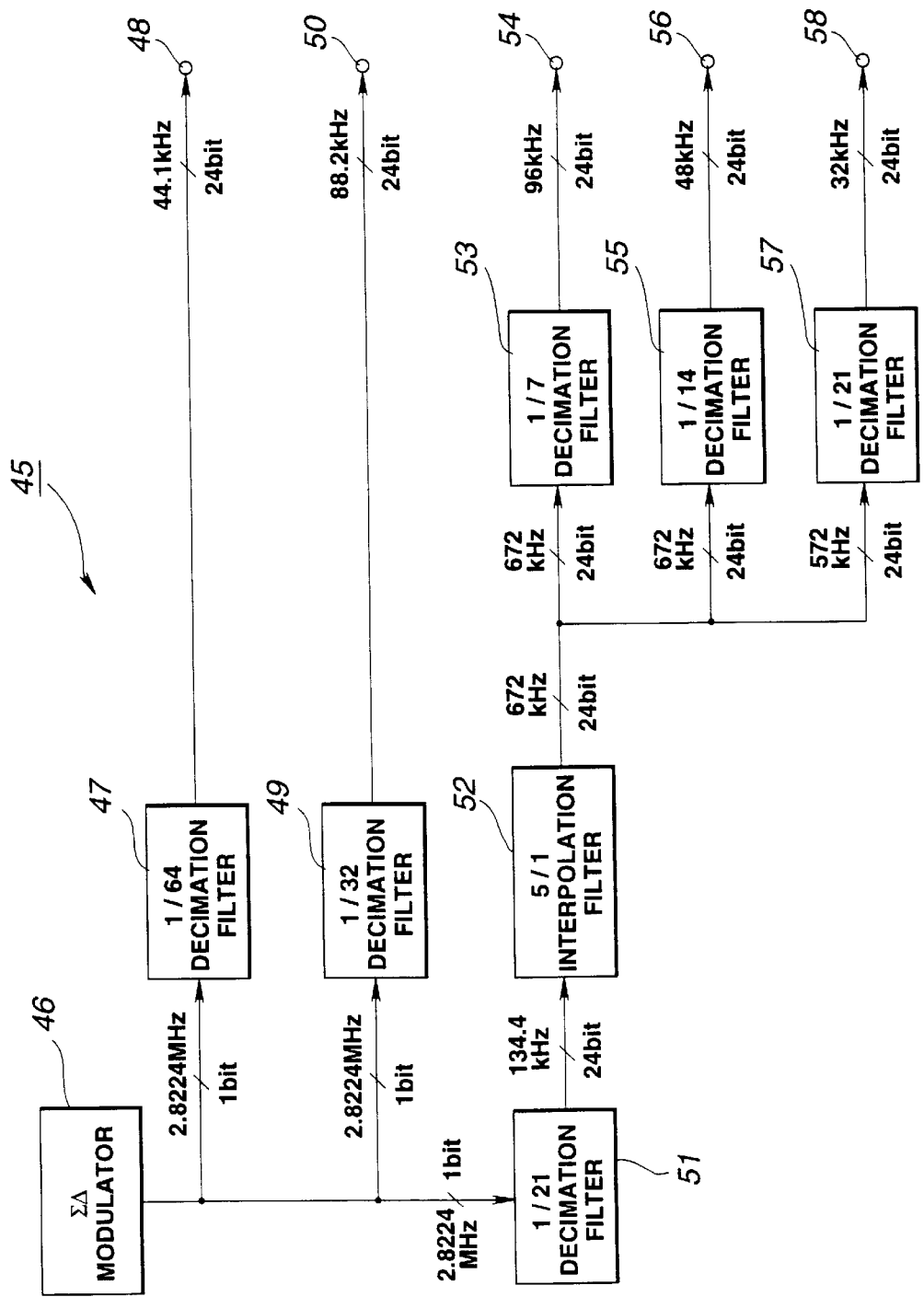
FIG. 5 is a block diagram showing an arrangement of a third embodiment of a rate converting device according to the present invention.

A preferred third embodiment of the method and apparatus of a sampling rate converter according to the present invention will be explained. The illustrated embodiment in FIG. 5 is directed to a rate converter 45 for converting the 1-bit digital data of 64 times 44.1 kHz of the sampling frequency, that is 2.8224 MHz, into multi-bit digital data, such as 24-bit multi-bit digital data, having the sampling frequencies of 44.1 kHz, 88.2 kHz, 96 kHz, 48 kHz and 32 kHz. It is noted that 88.2 kHz is the sampling frequency for high sampling audio data.

The rate converter 45 includes a decimation filter 47 for decimating the sampling frequency of 1-bit digital data with the sampling frequency of 2.8224 MHz supplied from the ΣΔ modulator 46 by 1/64 with an integer ratio of 64:1, and a decimation filter 49 for decimating the sampling frequency of the 1/bit digital data of 2.8224 MHz by 1/32 with an integer ratio of 32:1. The rate converter also includes a decimation filter 51 for decimating the sampling frequency of the 1/bit digital data of 2.8224 MHz by 1/21 with an integer ratio of 21:1, and an decimation filter 52 for quintuple oversampling of the frequency of the output of the decimation filter 51 with an integer ratio of 1:5. The rate converter also includes a decimation filter 53 for decimating the frequency of the output of the decimation filter 52 by 1/7 with an integer ratio of 7:1, and a decimation filter 55 for decimating the frequency of the output of the decimation filter 52 by 1/14 with an integer ratio of 14:1. The rate converter further includes a decimation filter 57 for decimating the frequency of the output of the decimation filter 52 by 1/21 with an integer ratio of 21:1.

The rate converter 45 operates as follows: The ΣΔ modulator 46 routes 1-bit digital data with a sampling frequency equal to 64 times 44.1 kHz, that is 2.8224 MHz, to the decimation filters 47, 49 and 51.

The decimation filter 47 re-quantizes the 1-bit digital data of 2.8224 MHz, after attenuation of the frequency not lower than 22.05 kHz, with a period of 44.1 kHz, equal to 1/64 times 2.8224 MHz, in order to output multi-bit digital data of 44.1 kHz/24 bits at an output terminal 48. This decimation filter 47 produces no jitter since it decimates the 1-bit digital data of 2.8224 MHz by the integer ratio of 64:1.

The decimation filter 49 re-quantizes the 1-bit digital data of 2.8224 MHz, after attenuation of the frequency not lower than 44.1 kHz, with a period of 88.2 kHz, which is 1/32 times 2.8224 MHz, in order to output multi-bit digital data of 88.2 kHz/24 bits at an output terminal 50. This decimation filter 49 produces no jitter since it decimates the 1-bit digital data of 2.8224 MHz by the integer ratio of 32:1.

The decimation filter 51 re-quantizes the 1-bit digital data of 2.8224 MHz, after attenuation of the frequency not lower than 67.2 kHz, with a period of 134.4 kHz, which is 1/21 times 2.8224 MHz, in order to output multi-bit digital data of 134.4 kHz/24 bits. This decimation filter 51 produces no jitter since it decimates the 1-bit digital data of 2.8224 MHz by the integer ratio of 21:1.

The multi-bit digital data of 134 kHz/24 bits is supplied to the interpolation filter 52, as explained previously.

The decimation filter 52 re-quantizes the multi-bit digital data of 134.4 kHz/24 bits with a period of 672 kHz by quintuple oversampling, as it attenuates the frequency not lower than 67.2 kHz, for outputting multi-bit digital data of 672 kHz/24 bits, and for supplying the data to the decimating filters 53, 55 and 57. The decimation filter oversamples the multi-bit digital data of 134.4 kHz/24 bits by an integer ratio of 1:5, so that no jitter is produced.

The decimation filter 53 re-quantizes the multi-bit digital data of 672 kHz/24 bits with a period of 96 kHz, which is 1/7 times 672 kHz, after attenuating the frequency not lower than 48 kHz, for outputting multi-bit digital data of 96 kHz/24 bits at an output terminal 54. The decimation filter 53 decimates the multi-bit digital data of 672 kHz/24 bits by an integer ratio of 7:1, so that no jitter is produced.

The decimation filter 55 re-quantizes the multi-bit digital data of 672 kHz/24 bits with a period of 48 kHz, which is 1/14 times 672 kHz, after attenuating the frequency not lower than 24 kHz, for outputting multi-bit digital data of 48 kHz/24 bits at an output terminal 56. The decimation filter 55 decimates the multi-bit digital data of 672 kHz/24 bits by an integer ratio of 14:1, so that no jitter is produced.

The decimation filter 57 re-quantizes the multi-bit digital data of 672 kHz/24 bits with a period of 32 kHz, which is 1/21 times 672 kHz, after attenuating the frequency not lower than 16 kHz, for outputting multi-bit digital data of 32 kHz/24 bits at an output terminal 58. The decimation filter 55 decimates the multi-bit digital data of 672 kHz/24 bits by an integer ratio of 21:1, so that no jitter is produced.

Thus it is possible with the rate converter 45 to reproduce the 1-bit digital data with the sampling frequency of 2.8224 MHz and to convert the 1-bit digital data into multi-bit digital data of 44.1 kHz/24 bits, 88.2 kHz/24 bits, 96 kHz/24 bits, 48 kHz/24 bits and 32 kHz/24 bits, as jitter generation is suppressed by filtering employing an integer ratio.

If the rate converter 45 is used in place of the rate converter 1 in the above disc reproducing apparatus 20, the 1-bit digital data with the sampling frequency of 2.8224 MHz may be reproduced, while the 1-bit digital data may be converted into multi-bit digital data of 44.1 kHz/24 bits, 88.2 kHz/24 bits, 96 kHz/24 bits, 48 kHz/24 bits and 32 kHx/24 bits, while the jitter is suppressed by filtering at an integer ratio.

Figure 6:
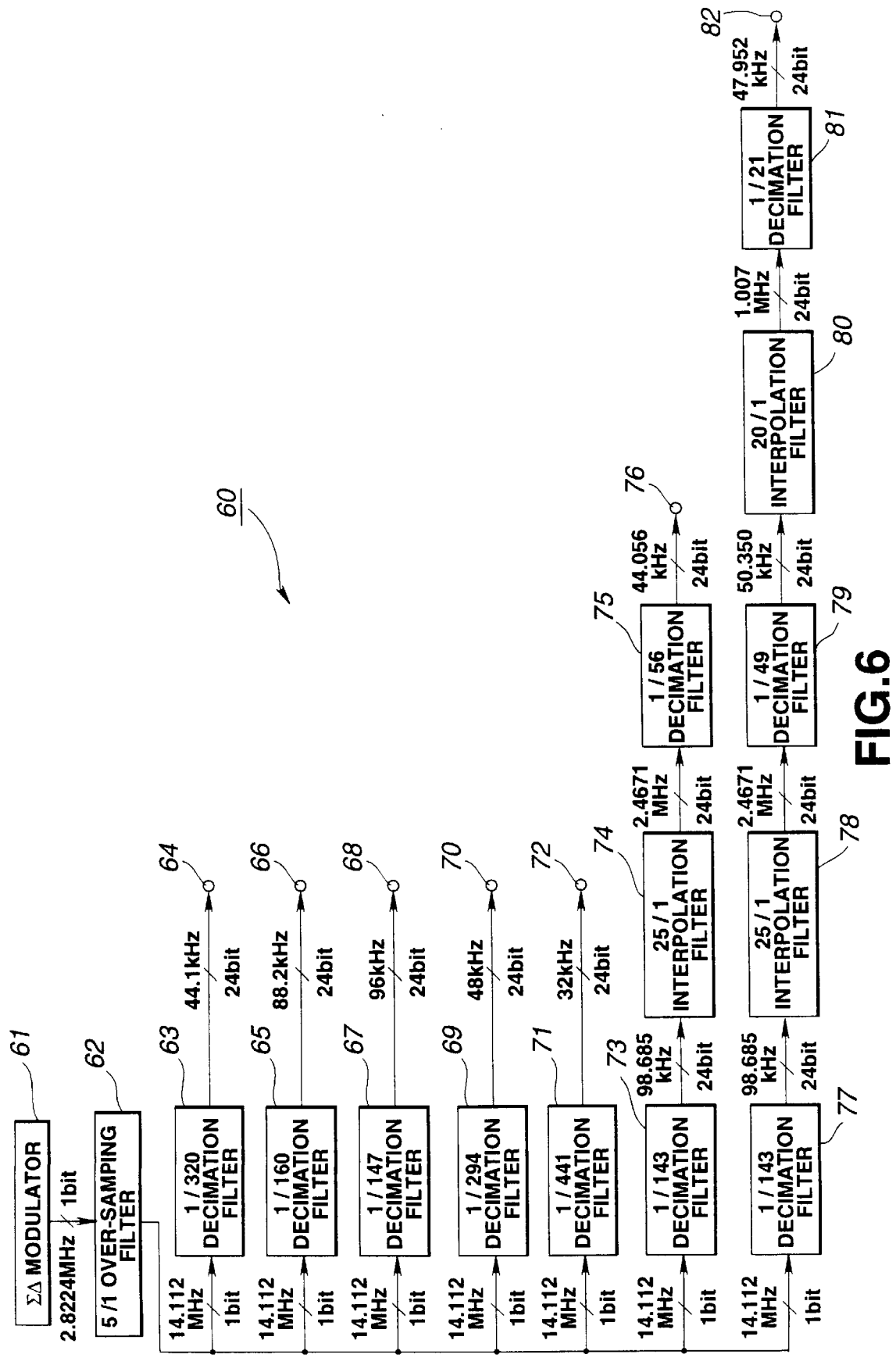
FIG. 6 is a block diagram showing an arrangement of a fourth embodiment of a rate converting device according to the present invention.

A preferred fourth embodiment of the method and apparatus according to the present invention will be explained. The illustrated embodiment in FIG. 6 is directed to a rate converter 60 for converting the 1-bit digital data of 64 times 44.1 kHz of the sampling frequency, that is 2.8224 MHz, into multi-bit digital data, such as 24 -bit digital date, having the sampling frequencies of 44.1 kHz, 88.2 kHz, 96 kHz, 48 kHz, 32 kHz, 44.056 kHz and 47.952 kHz. It is noted that 44.056 kHz is the sampling frequency for audio data used for NTSC video reproduction, such as a video disc, while 47.952 kHz is the sampling frequency for audio data used for high-vision broadcasting.

The present rate converter 60 includes a previous value holding type quintuple oversampling filter 62 for equally dividing the 1-bit digital data of the sampling frequency of 2.8224 MHz supplied from the ΣΔ modulator 61 by clocks having the quintuple frequency of 44.1 kHz×64×5=14.112 MHz for outputting the 1-bit digital data with the quintuple sampling frequency of 14.112 MHz, and a decimation filter 63 for decimating the digital data of 14.112 MHz/bit from the previous value holding type quintuple oversampling filter 62 by 1/320 for generating multi-bit digital data with the sampling frequency of 44.1 kHz/24 bits. The rate converter also includes a decimation filter 65 for decimating the digital data of 14.112 MHz/bit from the previous value holding type quintuple oversampling filter 62 by 1/160 for generating multi-bit digital data with the sampling frequency of 88.2 kHz/24 bits, and a decimation filter 67 for decimating the digital data of 14.112 MHz/ bit from the previous value holding type quintuple oversampling filter 62 by 1/147 for generating multi-bit digital data with the sampling frequency of 96 kHz/24 bits. The rate converter also includes a decimation filter 69 for decimating the digital data of 14.112 MHz/bit from the previous value holding type quintuple oversampling filter 62 by 1/294 for generating multi-bit digital data with the sampling frequency of 48 kHz/ 24 bits, and a decimation filter 71 for decimating the digital data of 14.112 MHz/bit from the previous value holding type quintuple oversampling filter 62 by 1/441 for generating multi-bit digital data with the sampling frequency of 32 kHz/24 bits. The rate converter also includes a generator for generating multi-bit digital data with a sampling frequency of 44.056 kHz/24 bits by decimating the 14.112 MHz/bit digital data from the previous value holding type quintuple oversampling filter 62 by 1/143, interpolating the resulting digital data by 25 and by decimating the resulting interpolated data by 1/56 for generating multi-bit digital data. The rate converter also includes a generator for generating multi-bit digital data with the sampling frequency of 47.952 kHz/24 bits by decimating the 14.112 MHz/bit digital data from the previous value holding type quintuple oversampling filter 62 by 1/143, interpolating the resulting digital data by 25 and decimating the resulting interpolated data by 1/21.

The multi-bit digital data generator for generating 44.056 kHz/24 bits includes a decimation filter 73 for decimating digital data of 14.112 MHz/bit by 1/143 with an integer ratio of 143:1, an decimation filter 74 for oversampling the frequency of the output of the decimation filter 73 by 25 with an integer ratio of 1:25 and a decimation filter 75 for decimating the frequency of the output of the decimation filter 74 by 1/56 with an integer ratio of 56:1.

The multi-bit digital data generator for generating multi-bit digital data of 47.952 kHz/24 bits includes a decimation filter 77 for decimating the sampling frequency of digital data of 14.112 MHz/bit by 1/143 with an integration of 143:1, and an interpolation filter 78 for oversampling the sampling frequency of the output of the decimation filter 77 by 25 with an integer ratio of 1:25. The multi-bit digital data generator also includes a decimation filter 79 for decimating the frequency of the output of the decimation filter 78 by 1/49 with an integer ratio of 49:1 and an interpolation filter 80 for oversampling the frequency of the output of the decimation filter 79 by 20 with an integer ratio of 1:20 and an decimation filter 80 for oversampling the sampling frequency of the output of the decimation filter 79 by 20 with an integer ratio of 1:20. The multi-bit digital data generator finally includes a decimation filter 81 for decimating the frequency of the output of the decimation filter 79 by 1/21 with an integer ratio of 21:1.

The rate converter 60 operates as follows: The ΣΔ modulator 60 routes 1-bit digital data with a sampling frequency equal to 64 times 44.1 kHz, that is 2.8224 MHz, to the previous value holding type quintuple oversampling filter 62.

Figure 7:
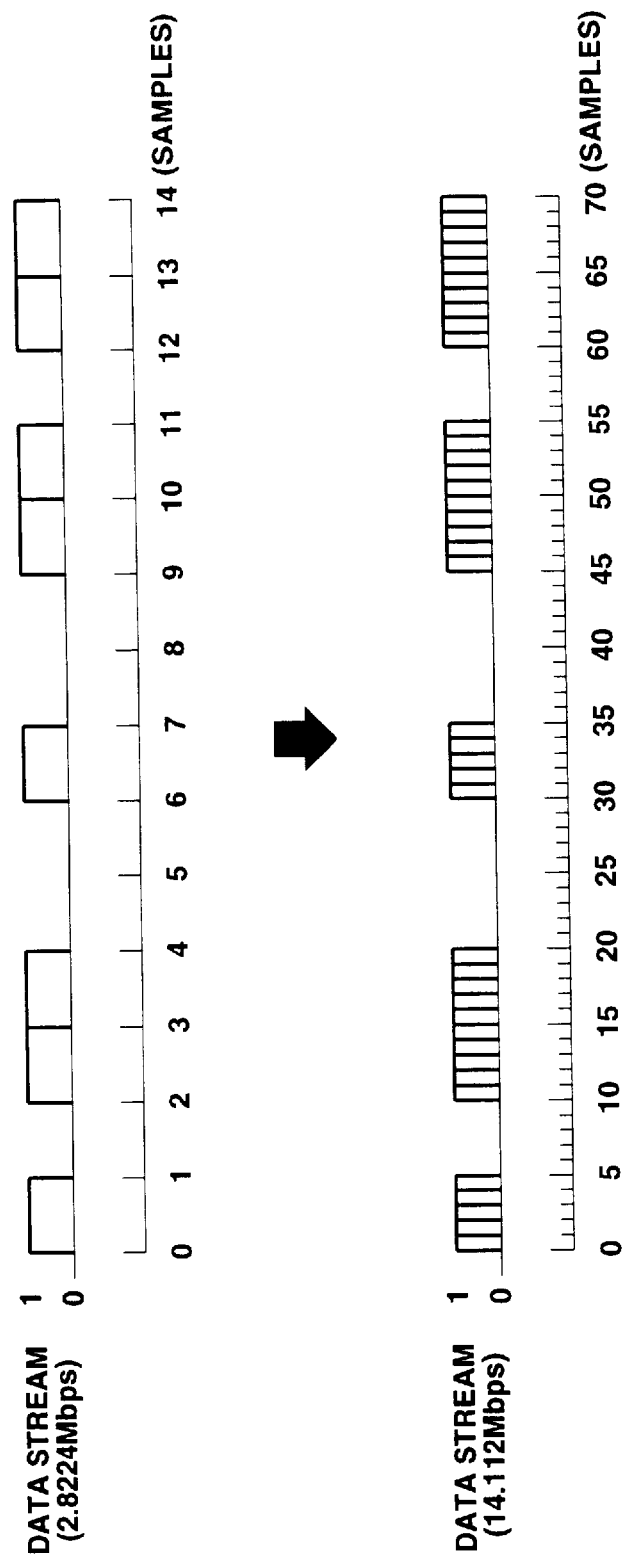
FIG. 7 is a timing chart for illustrating the principle of a pre-value hold type five-tuple oversampling filter employed in the fourth embodiment shown in FIG. 6.

Since the previous value holding type quintuple oversampling filter 62 generates digital data of 14.112 MHz/bit simply dividing the data in five equal portions with clocks fives times as large as 2.8224 MHz, as shown in FIG. 7, so that signal processing or re-quantization need not be performed and hence the data itself is not deteriorated in quality. The digital data of 14.112 MHz/bit outputted by the oversampling filter 62 is supplied to the decimation filters 63, 65, 67, 69, 71, 73 and 77, as mentioned previously.

The decimation filter 63 re-quantizes the digital data of 14.112 MHz/bit with a period of 44.1 kHz equal to 1/320 times 14.112 MHz after attenuating the frequency not lower than 22.05 kHz and subsequently outputs the 44.1 kHz/24 bit multi-bit digital data at the output terminal 64. The decimation filter 63 decimates the 14.112 MHz/bit digital data of 14.112 MHz by an integer ratio of 320:1, so that no jitter is produced.

The decimation filter 65 re-quantizes the digital data of 14.112 MHz/bit with a period of 88.2 kHz equal to 1/160 times 14.112 MHz after attenuating the frequency not lower than 44.1 kHz and subsequently outputs the multi-bit digital data of 88.2 kHz/24 bits at the output terminal 66. The decimation filter 65 decimates the 14.112 MHz/bit digital data of 14.112 MHz by an integer ratio of 160:1, so that no jitter is produced.

The decimation filter 67 re-quantizes the digital data of 14.112 MHz/bit with a period of 96 kHz equal to 1/147 times 14.112 MHz after attenuating the frequency not lower than 48 kHz and subsequently outputs the multi-bit digital data of 96 kHz/24 bits at the output terminal 68. The decimation filter 67 decimates the digital data of 14.112 MHz/bit by an integer ratio of 147.1, so that no jitter is produced. The decimation filter 69 re-quantizes the digital data of 14.112 MHz/bit with a period of 48 kHz equal to 1/294 times 14.112 MHz after attenuating the frequency not lower than 24 kHz and subsequently outputs the multi-bit digital data of 48 kHz/24 bits at the output terminal 70. The decimation filter 69 decimates the digital data of 14.112 MHz/bit by an integer ratio of 294:1, so that no jitter is produced.

The decimation filter 71 re-quantizes the digital data of 14.112 MHz/bit with a period of 32 kHz equal to 1/441 times 14.112 MHz after attenuating the frequency not lower than 16 kHz and subsequently outputs the multi-bit digital data of 32 kHz/24 bits at the output terminal 72. The decimation filter 71 decimates the digital data of 14.112 MHz/bit by an integer ratio of 441:1, so that no jitter is produced.

The decimation filter 73 re-quantizes the digital data of 14.112 MHz/bit with a period of 98.684 kHz equal to 1/143 times 14.112 MHz after attenuating the frequency not lower than 49.343 kHz and subsequently outputs the multi-bit digital data of 98.685 kHz/24 bits to the decimation filter 74. The decimation filter 73 decimates the digital data of 14.112 MHz/bit by an integer ratio of 143:1, so that no jitter is produced.

The decimation filter 74 oversamples the multi-bit digital data of 98.684 kHz/24 bits by 25-tuple oversampling, as the frequency not lower than 49.343 kHz is attenuated, and re-quantizes the digital data with a period of 2.4671 MHz for outputting multi-bit digital data of 2.4671 MHz/24 bits to the decimation filter 75. The interpolation filter 74 oversamples the multi-bit digital data of 98.684 kHz/24 bits by an integer ratio of 1:25, so that no jitter is produced.

The decimation filter 75 re-quantizes the digital data of 14.112 MHz/bit with a period of 44.056 kHz equal to 1/56 times that of the multi-bit digital data of 2.4671 MHz/24 bits, after attenuating the frequency not lower than 22.028 kHz, and subsequently outputs the multi-bit digital data of 44.056 kHz/24 bits to the output terminal 96. The decimation filter 75 decimates the digital data of 2.4671 MHz/24 bits by an integer ratio of 56:1, so that no jitter is produced.

The decimation filter 77 re-quantizes the digital data of 14.112 MHz/bit with a period of 98.684 kHz equal to 1/143 times that of the multi-bit digital data of 14.112 MHz/24 bits, after attenuating the frequency not lower than 22.028 kHz, and subsequently outputs the multi-bit digital data of 44.056 kHz/24 bits to the output terminal 96. The decimation filter 77 decimates the digital data of 14.112 MHz/1 bit by an integer ratio of 143:1, so that no jitter is produced.

The interpolation filter 78 oversamples the multi-bit digital data of 98.684 kHz/24 bits by 25-tuple oversampling, as the frequency not lower than 49.343 kHz is attenuated, and re-quantizes the digital data with a period of 2.4671 MHz for outputting multi-bit digital data of 2.4671 MHz/24 bits to the decimation filter 75. The decimation filter 78 oversamples the multi-bit digital data of 98.684 kHz/24 bits by an integer ratio of 1:25, so that no jitter is produced.

The decimation filter 79 re-quantizes the multi-digital data of 2.4671 MHz/24 bits with a period of 50.350 kHz equal to 1/49 times 2.4671 MHz, after attenuating the frequency not lower than 25.175 kHz, and subsequently outputs the multi-bit digital data of 50.350 kHz/24 bits to the decimation filter 80. The decimation filter 79 decimates the digital data of 2.4671 MHz/24 bits by an integer ratio of 49:1, so that no jitter is produced.

The decimation filter 80 oversamples the multi-bit digital data of 50.350 kHz/24 bits by 20-tuple oversampling, as the frequency not lower than 25.175 kHz is attenuated, and re-quantizes the digital data with a period of 1.007 MHz for outputting multi-bit digital data of 1.007 MHz/24 bits to the decimation filter 81. The decimation filter 80 oversamples the multi-bit digital data of 50.350 kHz/24 bits by an integer ratio of 1:20, so that no jitter is produced.

The decimation filter 81 re-quantizes the multi-digital data of 1.007 MHz/24 bits with a period of 47.952 kHz equal to 1/21 times 1.007 MHz, after attenuating the frequency not lower than 23.976 kHz, and subsequently outputs the multi-bit digital data of 47.952 kHz/24 bits at an output terminal 82.

Therefore, with the present rate converter 60, the 1-bit digital data with the sampling frequency of 2.352 MHz can be converted into multi-bit digital data of 44.1 kHz/24 bits, 88.2 kHz/24 bits, 96 kHz/24 bits, 48 kHz/24 bits, 32 kHz/24 bits, 44.056 kHz/24 bits and 47.952 kHz/24 bits, by the filtering employing an integer ratio without producing jitter.

In particular, with the present rate converter 60, the multi-bit digital data of the sampling frequency of 44.1 kHz, 88.2 kHz, 96 kHz, 48 kHz and 32 kHz can be generated by simply executing oversampling to 14.112 MHz/bit of 2.8224 MHz one-bit digital data, using a previous value holding quintuple oversampling filter 62, without signal processing or re-quantization, and by subsequently performing a sole re-quantization operation and a sole decimation operation by the decimation filters 63, 65, 67, 69 and 71, thus prohibiting signal deterioration from occurring.

The rate converter 60 can generate multi-bit digital data of 44.056 kHz/24 bits and multi-bit digital data of 47.952 kHz/24 bits by a multi-bit digital data generator of 44.056 kHz/24 bits and by a multi-bit digital data generator of 47.952 kHz/24 bits.

If the rate converter 60 is used in place of the rate converter 1 in the disc reproducing apparatus 20, the 1-bit digital data of the sampling frequency of 2.8224 MHz can be reproduced, while the 1-bit digital data can be converted into multi-bit digital data of 44.1 kHz/24 bits, 88.2 kHz/24 bits, 96 kHz/24 bits, 48 kHz/24 bits, 32 kHz/24 bits, 44.056 kHz/24 bits and 47.952 kHz/24 bits without producing jitter by filtering employing an integer ratio.

Figure 8:
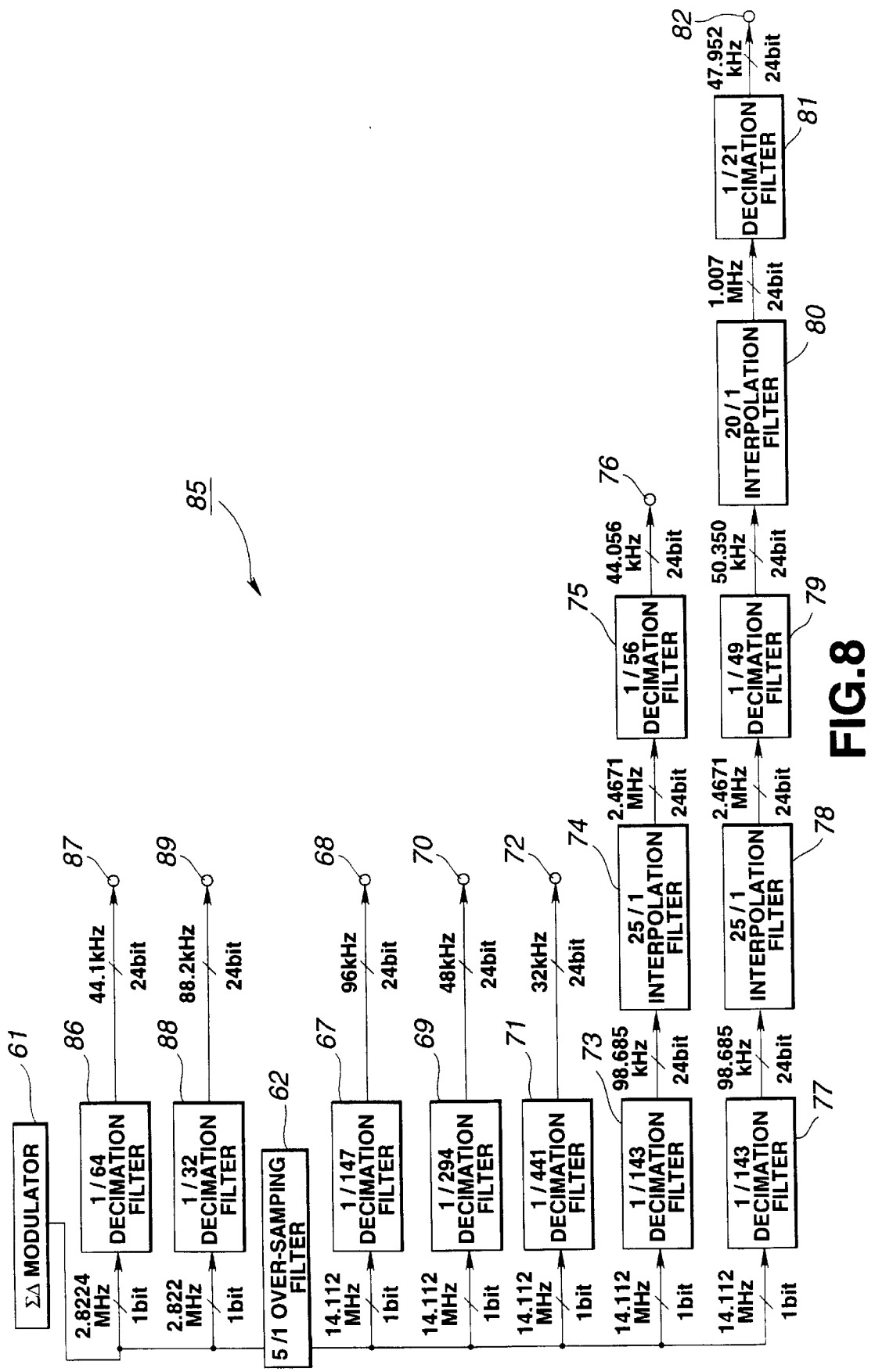
FIG. 8 is a block diagram showing an arrangement of a fifth embodiment of a rate converting device according to the present invention.

A preferred fifth embodiment according to the present invention will b e explained. The illustrated embodiment in FIG. 8 is likewise directed to a rate converter 85 for converting the 1-bit digital data of 64 times 44.1 kHz of the sampling frequency, that is 2.8224 MHz, to multi-bit digital data of, for example, 24 bits, having the sampling frequencies of 44.1 kHz, 88.2 kHz, 96 kHz, 48 kHz, 32 kHz, 44.056 kHz and 47.952 kHz, as shown in FIG. 7.

In particular, the present rate converting device 85 differs from the fourth embodiment as to the manner of generating multi-bit digital data of 44.1kHz/24 bits and 88.2 kHz/24 bits. The parts or components corresponding to those shown in FIG. 5 are denoted by the same reference numerals and are not described in detail for simplicity.

The digital data of 2.8224 MHz/one bit from the ΣΔ modulator 61 is supplied to a decimation filter 86 for decimating the input signal with 1/64-tuple decimation, a decimation filter 88 for decimating the input signal with 1/32-tuple decimation and a previous value holding type quintuple oversampling filter 62.

The decimation filter 86 re-quantizes the digital data of 2.8224 MHz/bit with a period of 44.1 kHz equal to 1/64 times 2.8224 MHz after attenuating the frequency not lower than 22.05 kHz and subsequently outputs the multi-bit digital data of 44.1 kHz/24 bits at the output terminal 87. The decimation filter 86 decimates the digital data of 2.8224 MHz/bit by an integer ratio of 64:1, so that no jitter is produced.

The decimation filter 88 re-quantizes the digital data of 2.8224 MHz/bit with a period of 88.2 kHz equal to 1/32 times 2.8224 MHz after attenuating the frequency not lower than 44.1 kHz and subsequently outputs the multi-bit digital data of 88.2 kHz/24 bits at an output terminal 89. The decimation filter 88 decimates the digital data of 14.112 MHz/bit by an integer ratio of 32:1, so that no jitter is produced.

The operation of respective portions downstream of the previous value holding quintuple oversampling filter 62 is the same as that of the fourth embodiment described previously.

Thus, with the present rate converter 85, the 1-bit digital data with the sampling frequency of 2.8224 MHz can be converted into multi-bit digital data of 44.1kHz/24 bits, 88.2 kHz/24 bits, 96 kHz/24 bits, 48 kHz/24 bits, 32 kHz/24 bits, 44.056 kHz/24 bits and 47.952 kHz/24 bits, by the filtering employing an integer ratio without producing jitter.

In particular, with the present rate converter 85, the multi-bit digital data of the sampling frequency of 96 kHz, 48 kHz and 32 kHz can be generated by simply executing oversampling to 14.112 MHz/bit of 2.8224 MHz one-bit digital data using a previous value holding quintuple oversampling filter 62, without signal processing or re-quantization and b subsequently performing a sole re-quantization operation and a sole decimation operation by the decimation filters 67, 69 and 71, thus prohibiting signal deterioration from occurring.

In addition, with the present rate converter 85, since the previous value holding quintuple oversampling filter 62 is by-passed when generating multi-bit digital data with the sampling frequencies of 44.1 kHz and 88.2 kHz, the decimation rate in the decimation filters 86 and 89 is decreased to one-fifth that of the fourth embodiment for diminishing the processing volume.

It is also possible with the present rate converter 85 to generate multi-bit digital data of 44.056 kHz/24 bits and multi-bit digital data of 47.952 kHz/24 bits by a multi-bit digital data generating unit for generating 44.056 kHz/24 bits and a multi-bit digital data generating unit for generating 47.952 kHz/24 bits.

Therefore, if the rate converter 85 is used in place of the rate converter 1 in the disc reproducing apparatus 20, the 1-bit digital data with the sampling frequency of 2.8224 MHz can be reproduced and converted into multi-bit digital data of 44.1 kHz/24 bits, 88.2 kHz/24 bits, 96 kHz/24 bits, 48 kHz/24 bits, 32 kHz/24 bits, 44.056 kHz/24 bits and 47.952 kHz/24 bits, by the filtering employing an integer ratio without producing jitter.

If, in the above-described fourth and fifth embodiments, multi-bit digital data other than the data of 47.952 kHz/24 bits, namely multi-bit digital data of 44.1kHz/24 bits, 88.2 kHz/24 bits, 96 kHz/24 bits, 49 kHz/24 bits, 32 kHz/24 bits and 44.056 kHz/24 bits, are desired to be generated, the respective sampling clocks can be generated by frequency dividing the sole master clocks equal to 8000 times 44.1 kHz. Since the data of respective sampling frequencies completely following the master clocks can be produced in this manner, it becomes possible to achieve simplified system configuration and the sampling frequency conversion of high sound quality free of interference otherwise caused between plural master clocks.

With the rate converter according to the present invention, since the sampling frequency of 44.1 kHz times 64 of 1-bit digital data is decimated by 21:1, oversampled by 1:5 m, m being an integer, and decimated by 7n:1, n being an integer, the frequencies of 32 kHz, 48 kHz and/or 96 kHz can be obtained by setting so that m=1 and n=1,2 and/or 3. Moreover, the frequency of 192 kHz can be obtained by setting so that m=2 and n=1. Since decimation and oversampling are done using a decimation filter and an oversampling filter, it becomes possible to prevent jitter from occurring.

With the rate converter according to the present invention, the sampling frequency of the 1-bit digital data having the sampling frequency of 48 kHz times 49 can be decimated by 5:1, oversampled by 1:3 and subsequently decimated by 32:1 for generating 44.1 kHz. Since the decimation and oversampling is carried out using an integer ratio by the decimation filter and the oversampling filter, it becomes possible to prevent jitter from being produced.

With the rate converter according to the present invention, since the multi-bit digital data of 44.1 kHz, 88.2 kHz, 96 kHz, 48 kHz and 32 kHz can be generated by a sole quantization operation and by a sole decimation operation, it becomes possible to prevent the deterioration in the sound quality.

Likewise, with the rate converter according to the present invention, it is also possible to generate multi-bit digital data with 44.056 kHz and 47.952 kHz.

We claim:

1. A method for converting 1-bit digital audio data that is quantized by a first sampling frequency Fi×α (Hz) to multi-bit digital audio data that is quantized by a second sampling frequency lower than the first sampling frequency Fi×α (Hz), where Fi and α are integers, the method comprising the steps of:

performing a first variable decimation step of multiplying the 1-bit digital audio data by 1/β and producing multi-bit digital data, where β is an integer;

performing an oversampling step of multiplying the multi-bit digital data produced by said first variable decimation step by 5×m, where m is an integer; and performing a second variable decimation step of multiplying the multi-bit digital data that is sampled by (Fi×α×5×m)/β (Hz) by 1/(7×n), where n is an integer, whereby the input 1-bit digital audio data that is quantized by the first sampling frequency Fi×α (Hz) is converted to the multi-bit digital audio data that is quantized by the second sampling frequency (Fi×α×5×m)/(β×7×n) (Hz) less than the first sampling frequency Fi×α (Hz).

2. A sampling rate converting apparatus for converting 1-bit digital audio data that is quantized by a first sampling frequency Fi×α (Hz) to multi-bit digital audio data that is quantized by a second sampling frequency lower than the first sampling frequency Fi×α (Hz), where Fi is an integer and a is an integer, the apparatus comprising:

first variable decimation means for multiplying the 1-bit digital audio data received as an input signal by 1/β and producing multi-bit digital data, where β is an integer, over sampling means for multiplying the multi-bit digital data produced by said first variable decimation means by 5×m, where m is an integer, and second variable decimation means for multiplying the multi-bit digital data that is sampled by (Fi×α×5×m) /β (Hz) by 1/(7×n), where n is an integer, whereby the input 1-bit audio data that is quantized by the first sampling frequency Fi×α (Hz) is converted to the multi-bit digital audio data that is quantized by the second sampling frequency (Fi×α×5×m)/(β×7×n)(Hz) that is lower than the first sampling frequency Fi×α (Hz).

3. The sampling rate conversion apparatus as claimed in claim 2 wherein Fi is set at 44.1 kHz and wherein the second sampling frequency is set at 32 kHz by setting a α=64, β=21, m=1 and n=3.

4. The sampling rate conversion apparatus as claimed in claim 2 wherein Fi is set at 44.1 kHz and wherein the second sampling frequency is set at 48 kHz by setting α=64, β=21, m=1 and n=2.

5. The sampling rate conversion apparatus as claimed in claim 2 wherein Fi is set at 44.1 kHz and wherein the second sampling frequency is set at 96 kHz by setting α=64, β=21, m=2 and n=2.

6. The sampling rate conversion apparatus as claimed in claim 2 wherein Fi is set at 44.1 kHz and wherein the second sampling frequency is set at 192 kHz by setting α=64, β=21, m=2 n=1.

7. A method for converting 1-bit digital audio data that is quantized by a first sampling frequency Fi×α (Hz) to multi-bit audio data that is quantized by a second sampling frequency lower than the first sampling frequency Fi×α (Hz), where Fi is an integer and α is an integer, the method comprising the steps of:

performing a first variable decimation step of multiplying the 1-bit digital audio data by 1/β, and producing multi-bit digital data, where β is an integer;

performing an oversampling step of multiplying the multi-bit digital data produced by said first variable decimation step by δ, where δ is an integer; and performing a second variable decimation step of multiplying the multi-bit digital data that is sampled by (Fi×α×δ)/B×J (Hz) by 1/σ, where σ is an integer, whereby the input 1-bit digital audio data that is quantized by the first sampling frequency Fi×α (Hz) is converted to the multi-bit digital audio data that is quantized by the second sampling frequency (Fi×α×δ)/B×σ (Hz) that is lower than the first sampling frequency Fi×α (Hz).

8. An apparatus for converting 1-bit digital audio data that is quantized by a first sampling frequency Fi×α (Hz) to multi-bit digital audio data that is quantized by a second sampling frequency lower than the first sampling frequency Fi×α (Hz), where Fi and α are integers, the apparatus comprising:

first variable decimation means for multiplying the 1-bit digital audio data of an input signal by 1/β and producing multi-bit digital data, where β is an integer, over sampling means for multiplying the multi-bit digital data produced by said first variable decimation means by δ, wherein δ is an integer, and second variable decimation means for multiplying the multi-bit digital data that is sampled by (Fi×α×σ)/β (Hz) by 1/σ, where σ is an integer, whereby the input 1-bit audio data that is quantized by the first sampling frequency Fi×α (hz) is converted to the multi-bit digital audio data that is quantized by the second sampling frequency (Fi×α×δ)/(β×σ)(Hz) that is lower than the first sampling frequency Fi×α (Hz).

9. The sampling rate conversion apparatus as claimed in claim 8 wherein Fi is set at 48 kHz and wherein the second sampling frequency is set at 44.1 kHz by setting α=49, β=5, δ=3 and σ=32.

* * * * *